US005502768A

United States Patent [19]

Shioda

[11] Patent Number: 5,502,768

[45] Date of Patent: Mar. 26, 1996

[54] REVERBERATOR

[75] Inventor: Kazuaki Shioda, Shizuoka, Japan

[73] Assignee: Kabushiki Kaisha Kawai Gakki Seisakusho, Japan

[21] Appl. No.: 406,778

[22] Filed: Mar. 17, 1995

Related U.S. Application Data

[63] Continuation of Ser. No. 125,591, Sep. 23, 1993, abandoned.

[30] Foreign Application Priority Data

Sep. 28, 1992 [JP] Japan .................................. 4-281100

[51] Int. Cl.[6] ....................................................... H03G 3/00

[52] U.S. Cl. ................................................ 381/61; 381/98

[58] Field of Search .................................. 381/61, 63, 98

[56] References Cited

U.S. PATENT DOCUMENTS 3,213,180 10/1965 Cookerly et al. .

4,087,629 5/1978 Atoji et al. ................................ 381/63

4,182,930 1/1980 Blackmer .................................. 381/28

4,584,701 4/1986 Nakama et al. .......................... 381/63

4,739,514 4/1988 Short et al. .............................. 381/98

*Primary Examiner*—Forester W. Isen

*Attorney, Agent, or Firm*—Andrus, Sceales, Starke & Sawall

[57] ABSTRACT

Disclosed is a reverberator that comprises: distorted signal generating means for outputting a distorted signal obtained by distorting an input tone signal; predetermined frequency band signal passing means for passing a signal for a predetermined frequency band within a distorted signal; tone signal mixing means for mixing the input tone signal with the predetermined frequency band signal; and reverberation adding means for outputting a reverberation added signal obtained by adding reverberation to the mixed tone signal.

9 Claims, 6 Drawing Sheets

REVERBERATOR

The present application is a continuation application of U.S. patent application, Ser. No. 08/125,591, filed Sep. 23, 1993, and now abandoned.

BACKGROUND OF THE INVENTION

1. Field of the Invention

The present invention relates to a reverberator, used for an electronic musical instrument or an accompaniment music playing apparatus, that adds reverberation to an input sound signal.

2. Description of the Related Art

A conventional reverberator, when mounted on an electronic musical instrument or a karaoke apparatus (an apparatus for playing recorded music to accompany a singer), adds reverberations to an input sound signal to improve musical tones in a high tone range, to provide increased depth and body for output musical tones and to induce a desirable aural sensation, such as a romantic, dreamlike effect.

Well known are such reverberators as mechanical reverberators and digital reverberators. Mechanical reverberators employ an oscillation characteristic of a metal plate or a coil spring member to add reverberation to an input tone signal, while digital reverberators combine multiple tone signals that have different delay times to obtain a like result.

With the prior art reverberators, however, resonance occurs when an input tone signal, to which reverberation is added, is a pure tone, which is an overtone that is represented by a sine wave. A resonance phenomenon that occurs, i.e., a so-called flutter echo, prevents the production of a preferable reverberation characteristic.

SUMMARY OF THE INVENTION

It is therefore an object of the present invention to provide a preferable reverberation characteristic by producing and employing an optimal high frequency band signal to add reverberation when an input tone signal is for a pure tone that is an overtone represented by a sine wave.

It is another object of the present invention to automatically produce a high frequency band signal, having higher components, that is employed to add optimal reverberation to an input tone signal when the input tone signal has a narrow high frequency band of higher components, that is, predetermined overtones.

It is still another object of the present invention to provide a reverberator that can automatically produce a high frequency band signal having higher components to provide a more desirable reverberation characteristic when the level of an input tone signal exceeds a predetermined amplitude level.

To achieve the first object, a reverberator according to the present invention comprises: distorted signal generating means for outputting a distorted signal obtained by distorting an input tone signal; predetermined frequency band signal passing means for passing a signal for a predetermined frequency band within a distorted signal; tone signal mixing means for mixing the input tone signal with the predetermined frequency band signal; and reverberation adding means for outputting a reverberation added signal obtained by adding reverberation to the mixed tone signal.

To achieve the second object, in addition to the arrangement for the first object, a reverberator according to the present invention further comprises frequency response monitoring and control means for, when a high frequency band signal for a preset overtone component is not detected in a frequency response of the input tone signal, adjusting the distorted signal generating means to output a distorted signal that is acquired by adding a predetermined distortion to the input tone signal.

To achieve the third object, in addition to the arrangement for the first object, a reverberator according to the present invention comprises amplitude level monitoring and control means for, when the input tone signal exceeds a preset amplitude level, adjusting the distorted signal generating means to output a distorted signal that is acquired by adding a predetermined distortion to the input tone signal.

In addition to the above described arrangements, a reverberator of the present invention further comprises output tone signal mixing means for transmitting a reverberation-added output signal that is obtained by mixing a reverberation-added tone signal from the reverberation adding means with the input tone signal.

With such arrangements, a reverberator according to the present invention extracts only a specific frequency band signal from a distorted signal that is obtained by distorting an input tone signal, mixes the input tone signal with the specific frequency band signal, adds reverberation to the resultant signal, and generates a high frequency band signal to which optimal reverberation can be added when an input tone signal is for a pure tone, that is, for only a sine wave overtone, to provide a preferable reverberation characteristic.

Further, when a high frequency band signal for a preset overtone in the frequency response of an input tone signal cannot be detected, the reverberator of the present invention outputs a distorted signal that is obtained by providing an input tone signal with a predetermined reverberation, and when an input tone signal has a narrow high frequency band of higher components that are predetermined overtones, a high frequency band signal having higher components, to which optimal reverberation can be added, is automatically produced to provide a preferable reverberation characteristic.

When an input tone signal level exceeds a preset amplitude level, or when the amplitude level of, for example, a percussion instrument sound signal exceeds the preset amplitude level, the reverberator outputs a distorted signal that is obtained by providing the input tone signal with predetermined reverberation, and when the input tone signal has a narrow high frequency band of higher components that are predetermined overtones, a high frequency band signal of higher components, to which optimal reverberation can be added, is automatically generated to obtain a desirable reverberation characteristic.

DETAILED DESCRIPTION OF THE PREFERRED EMBODIMENTS

The preferred embodiments of a reverberator according to the present invention will now be described in detail while referring to the accompanying drawings.

Figure 1:
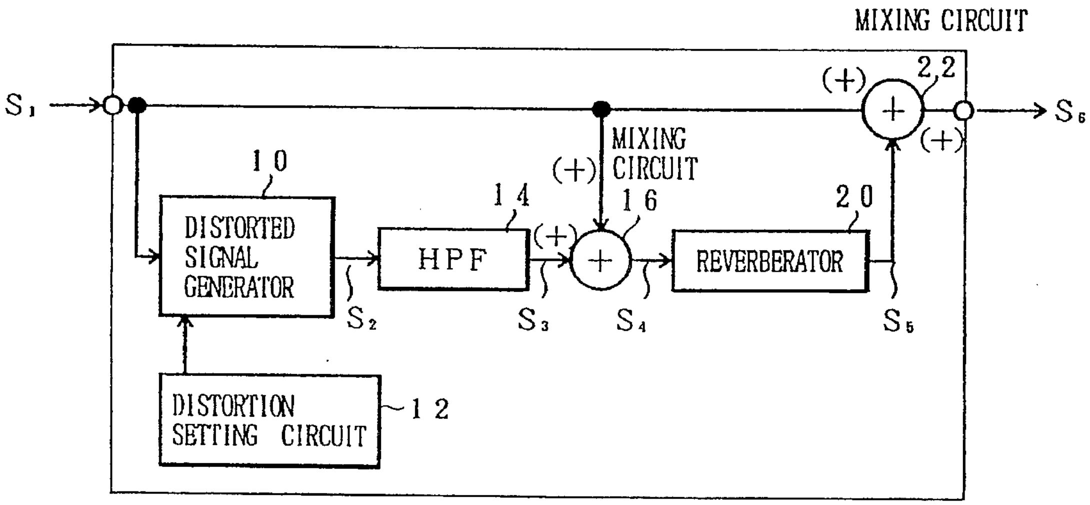
FIG. 1 is a block diagram illustrating the arrangement of a reverberator according to the first embodiment of the present invention.

Provided in the arrangement of the first embodiment in FIG. 1 are a distorted signal generator 10, which receives and distorts an input tone signal $S_1$ and outputs an obtained distorted signal $S_2$, and a distortion setting circuit 12, which determines the amount of distortion that the distorted signal generator 10 performs. The distorted signal generator 10 and the distortion setting circuit 12 correspond to distorted signal generating means defined in the claims.

Further provided are an HPF (High Pass Filter) 14 (which corresponds to predetermined frequency band signal passing means defined in the claims), which passes only a high band tone signal $S_3$ that is for a high frequency band within the distorted signal $S_2$, and a mixing circuit 16 (which corresponds to tone signal mixing means), which mixes the high band tone signal $S_3$ with the input tone signal $S_1$.

The arrangement also includes a reverberator 20 (which corresponds to reverberation adding means defined in the claims), which adds reverberation to a mixed tone signal $S_4$ received from the mixing circuit 16 and outputs a reverberation-added tone signal $S_5$, and a mixing circuit 22 (which corresponds to output tone signal mixing means defined in the claims), which mixes the input tone signal $S_1$ with the reverberation-added tone signal $S_5$ at a proper signal level ratio, and outputs a reverberation-added output signal $S_6$ having a desirable reverberation characteristic.

For analog processing, a common operational amplifier is used as the distorted signal generator 10 in this embodiment. For waveform clipping, the distortion setting circuit 12 is adapted to perform excess amplification by setting a small resistance for a feedback resistor, which determines the amplification of the operational amplifier, using a variable resistor, i.e., either a manually or an electronically controlled volume.

For digital processing, bit shifting is performed so as to cause waveform clipping. More specifically, an input waveform value is shifted bit by bit in consonance with an amplification factor. As a value of each bit is shifted out and lost, waveform clipping occurs.

For analog processing, a filter that consists of a common capacitor and a common resistor is employed as the HPF 14; while an IIR filter or an FIR filter is employed for digital processing.

To perform an analog process, a mechanical reverberator that utilizes the vibration characteristic of a metal plate or spring member is employed as the reverberator 20, and to perform a digital process, a digital reverberator that merges multiple musical tones having different delay times is employed.

For analog processing, employed as each of the mixing circuits 16 and 22 are variable resistors, which are connected in series along two input paths to determine a proper level ratio, and a mixing circuit, which connects one end of a fixed resistor to the output terminals of the respective variable resistors and which connects the other end of the fixed resistor to terminals of other components.

Further, for digital processing, the mixing circuits 16 and 22 multiply a tone signal by a predetermined coefficient and determine a proper level ratio. The mixing circuits 16 and 22 temporarily store the result in a register, etc., and add the result to the next multiplication result to perform mixing.

The processing of the thus structured first embodiment will now be described.

Figure 2:
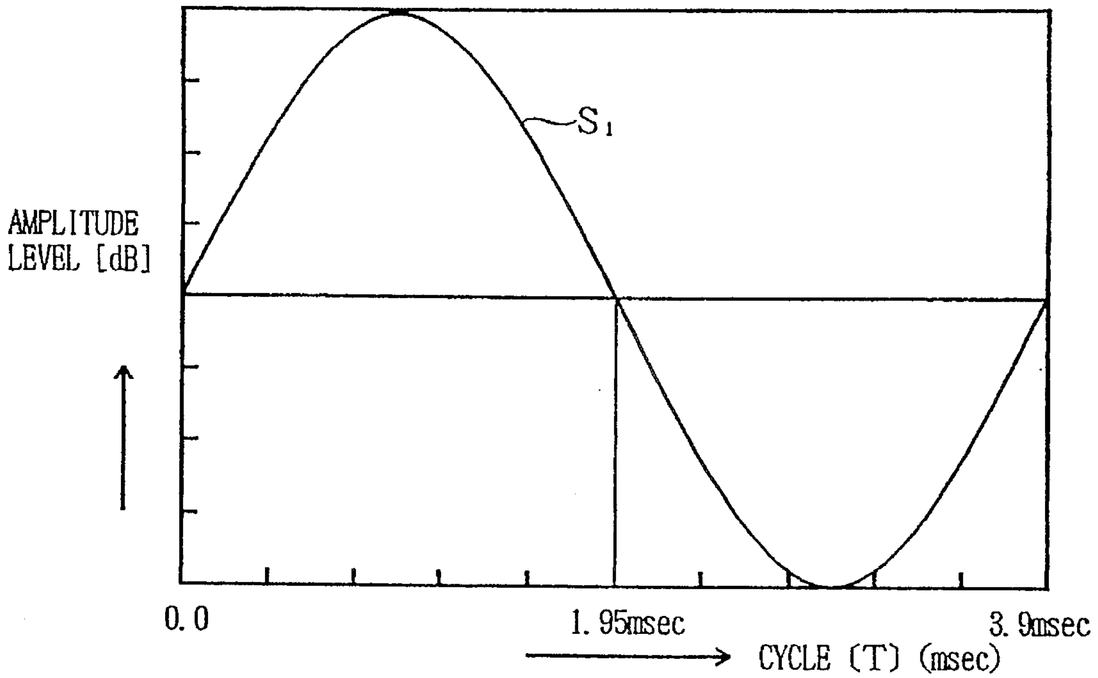
FIG. 2 is a waveform diagram, showing a sine wave for an input tone signal, for explaining the processing of the first, second and third embodiments of the present invention.

FIG. 2 represents a sine wave signal included in an input tone signal $S_1$. The vertical axis indicates an amplitude level [dB], the horizontal axis indicates a cycle [T]. Cycle [T] of the sine wave signal shown in the graph is about 3.9 msec, i.e., frequency [F] is 256 Hz.

The input tone signal $S_1$ is transmitted to the distorted signal generator 10, which outputs a distorted signal $S_2$ whose waveform amplitude is clipped in consonance with an amplification factor that is preset by the distortion setting circuit 12. (The amplification factor in this case is excess amplification.)

Figure 3:
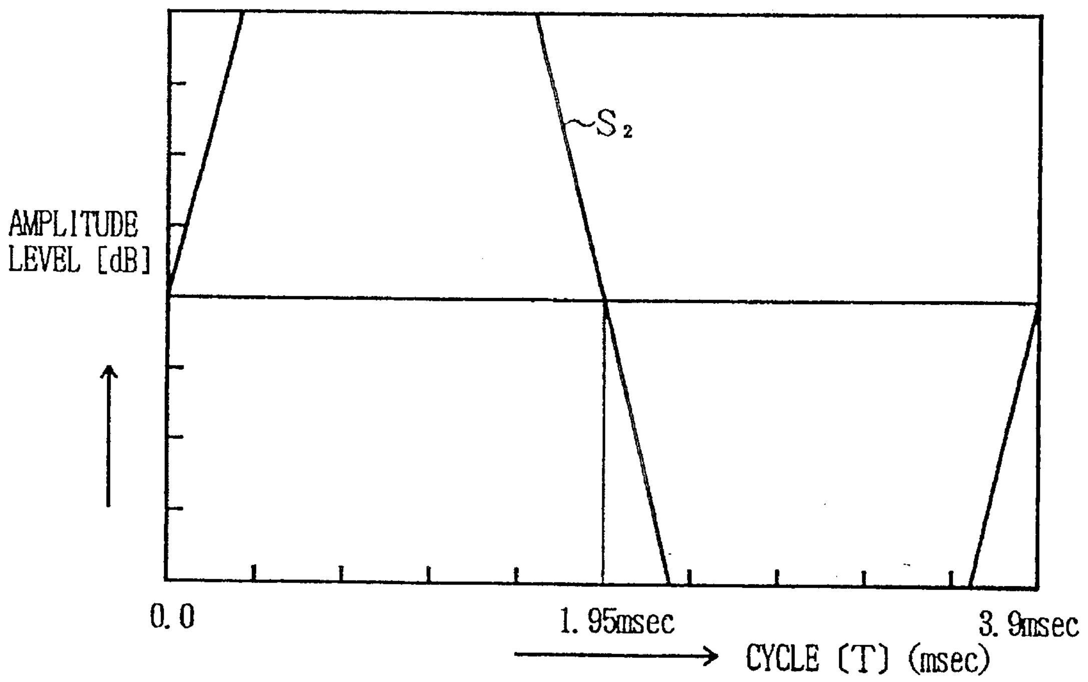
FIG. 3 is a graph, showing a waveform of a distorted signal, for explaining the processing the embodiments.

The distorted signal $S_2$ is shown in FIG. 3. Cycle [T] and the maximum amplitude level are the same as those of the input tone signal $S_1$, but the amplitude of the distorted signal $S_2$ is clipped and distortion has occurred. In other words, a higher component is produced by distortion.

Figure 4:
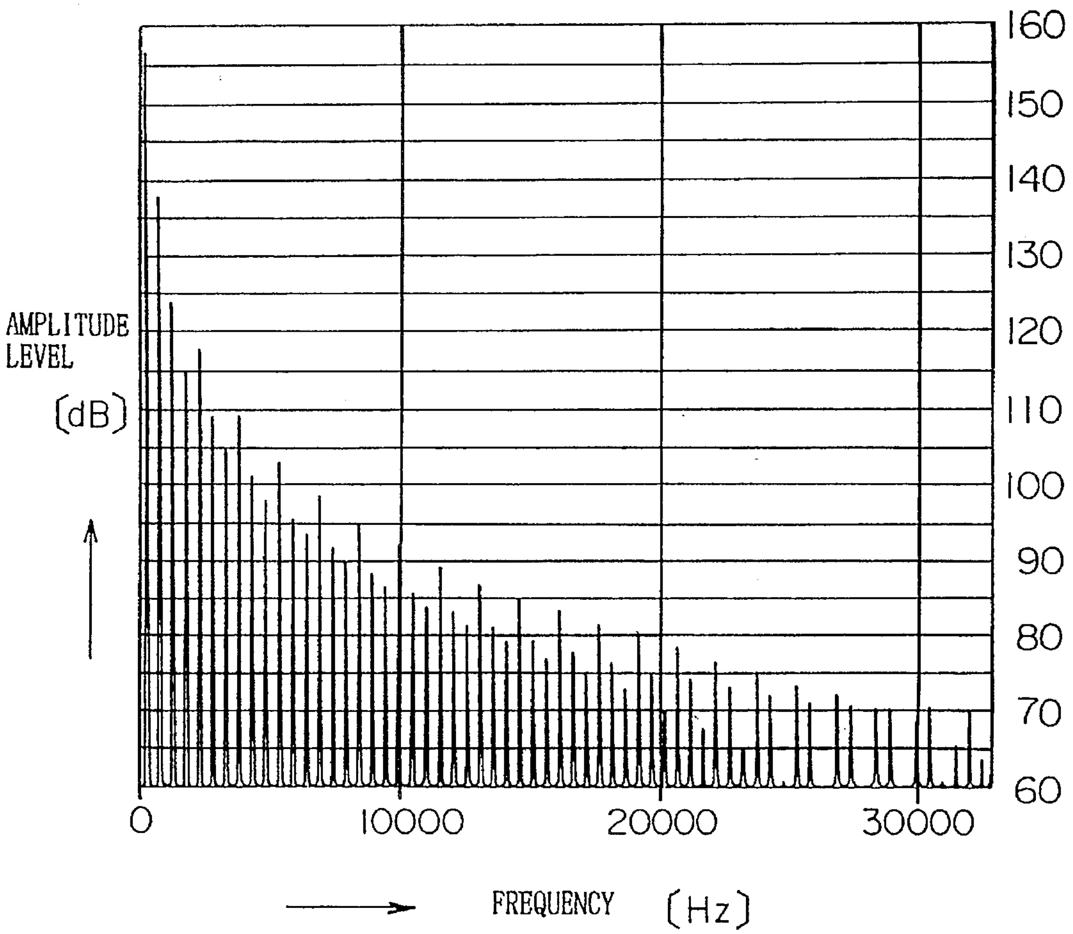
FIG. 4 is a spectrum diagram, showing a distorted signal on which a fast Fourier transform is performed, for explaining the processing of the embodiments.

FIG. 4 shows a waveform that is obtained by analyzing the distorted signal $S_2$ by fast Fourier transform (FFT) using a spectrum analyzer. In FIG. 4, the vertical axis indicates an amplitude level [dB], and the horizontal axis indicates a frequency [Hz]. The frequency at the extreme left is 256 Hz, which corresponds to waveform portions depicted in FIGS. 2 and 3. A higher component has occurred in the distorted signal $S_2$ as is shown in the frequency distribution in FIG. 4.

Only a high band tone signal $S_3$, of the distorted signal $S_2$, that is in a high frequency band of higher components, i.e., overtones, passes through the HPF 14. An empirically determined frequency of 6 to 8 KHz or higher is sufficient for the addition of reverberation, and is adequate for the high band tone signal $S_3$.

The high band tone signal $S_3$ and the input tone signal $S_1$ are transmitted to the mixing circuit 16 and mixed. A mixed tone signal $S_4$ is then transmitted to the reverberator 20, which adds reverberation to the received tone signal $S_4$ and outputs a reverberation-added tone signal $S_5$.

The reverberation-added tone signal $S_5$ is transmitted with the input tone signal $S_1$ to the mixing circuit 22, which mixes both signals $S_1$ and $S_5$ at an adequate level ratio and outputs the resultant reverberation-added tone signal $S_6$.

In this process, the high band tone signal $S_3$ from the mixing circuit 16 includes a high frequency band signal, of higher components for overtones, which is optimal for the addition of reverberation. More specifically, since when the addition of reverberation is performed the input tone signal $S_1$ is no longer for a pure tone that consists of only a sine wave overtone, the occurrence of a resonance phenomenon (flutter echo) can be prevented, and a reverberation-added output signal $S_6$ that has a desirable reverberation characteristic can be obtained.

Even if the reverberation-added tone signal $S_5$, from the reverberator 20, is not mixed with the input tone signal $S_1$, by the mixing circuit 22, and is employed as a reverberation-added output signal $S_6$, substantially the same action and effect can be obtained.

The second embodiment of the present invention will now be described.

In this embodiment, the frequency response of an input tone signal $S_1$ is monitored. When there are few high frequency band signals for higher components of predetermined overtones, excess amplification is set for the distortion setting circuit 12 and, to provide a reverberation-added output tone signal $S_6$ having a preferable reverberation characteristic, the distorted signal generator 10 outputs a desirable distorted signal $S_2$.

Figure 5:
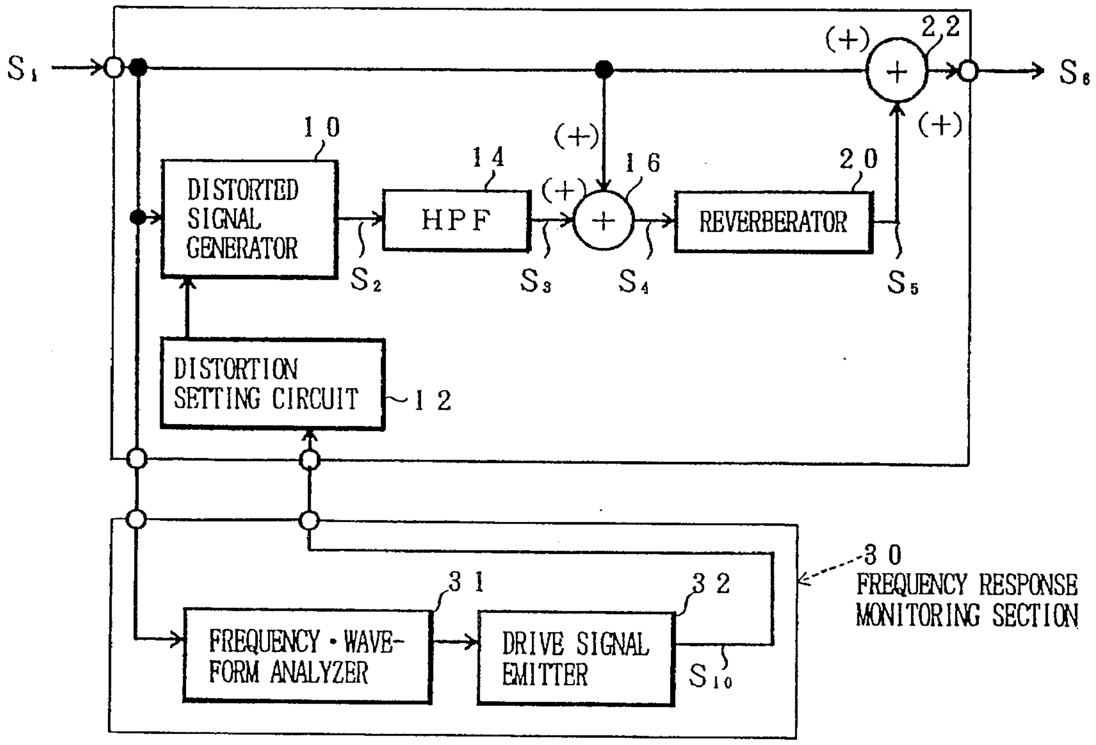
FIG. 5 is a block diagram illustrating the second embodiment of the present invention.

FIG. 5 illustrates the arrangement of the second embodiment, which includes a frequency response monitoring section 30 in addition to the arrangement of the first embodiment. The frequency response monitoring section 30 has a frequency/waveform analyzer 31, which is similar to a spectrum analyzer that monitors the frequency response of the input tone signal $S_1$, that performs FFT analysis. A high frequency band signal of predetermined overtone components is monitored by the frequency/waveform analyzer 31, and when a high frequency band signal of preset higher components is not detected, a signal that indicates the detection result is output.

The frequency response monitoring section 30 also includes a drive signal transmitter 32 that, upon receipt of the detection result signal, transmits a drive signal $S_{10}$ to drive a variable resistor, etc. (not shown) in the distortion setting circuit 12.

Processing of the second embodiment will now be described.

The processing performed by the components that correspond to those in the first embodiment is the same as that described for the first embodiment. In addition to the processing that is described for the first embodiment, the frequency/waveform analyzer 31 of the frequency response monitoring section 30 in the second embodiment monitors the frequency response of the input tone signal $S_1$, i.e., a high frequency band signal of overtone components. When a high frequency band signal of preset overtone components is not detected, the frequency/waveform analyzer 31 outputs a signal that indicates the detection result.

The detection result signal is sent to the drive signal transmitter 32, which then transmits the drive signal $S_{10}$ that is employed to control the variable resistor (not shown) in the distortion setting circuit 12.

The drive signal $S_{10}$ is transmitted to the distortion setting circuit 12, which sets the amount of distortion so that the distorted signal generator 10 outputs a distorted signal $S_2$ whose amplitude is clipped in consonance with excess amplification.

The succeeding processing is the same as is described for the first embodiment. In the second embodiment, a reverberation-added signal $S_6$ that has a desirable reverberation characteristic and that corresponds to the frequency response of the input tone signal $S_1$ is automatically and constantly produced.

The frequency/waveform analyzer 31 will be further explained in detail.

The frequency/waveform analyzer 31 monitors the frequency response of the input tone signal $S_1$, i.e., a high frequency band signal for overtone components. When the frequency/waveform analyzer 31 does not detect a high frequency band signal of preset overtone components, it outputs a signal that indicates the detection result.

More specifically, the frequency band of the input tone signal $S_1$ is first divided into, for example, 500 levels, and these obtained levels are displayed. A level detector that is provided for each division of the frequency band presets a threshold value. When a frequency level exceeds a threshold value, a detection signal is output.

The detection signal is sent to and processed by a control section, such as a CPU. When a detection signal is not obtained at, for example, the fiftieth level out of the 500 levels of the divided frequency band, a detection signal is output to the drive signal transmitter 32.

The third embodiment of the present invention will now be described. In this embodiment, when the detected amplitude level of the input tone signal $S_1$ is greater than a predetermined level, a signal $S_2$ with additional distortion is output by the distorted signal generator 10 at a higher amplitude level, similar to that of a percussion tone signal, to provide a reverberation-added output signal $S_6$ having a preferable reverberation characteristic.

Figure 6:
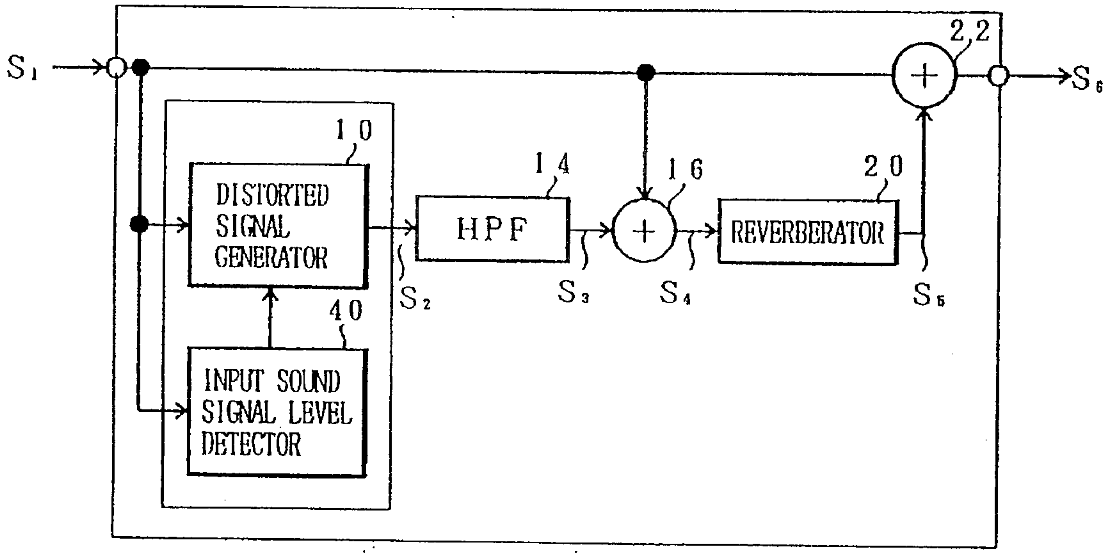
FIG. 6 is a block diagram illustrating the third embodiment of the present invention.

FIG. 6 illustrates the arrangement of the third embodiment, which has an input tone signal level detector 40 in addition to the arrangement of the first embodiment in FIG. 1. For analog processing, the input tone signal level detector 40 and the distorted signal generator 10 are constituted by voltage control amplifiers (VCA).

With such an arrangement, when the amplitude level (voltage value) of the input tone signal $S_1$ is high, i.e., when the amplitude level is higher, similar to that of a percussion sound signal, a large amplification factor for the distorted signal generator 10 is set, and a distorted signal $S_2$, whose amplitude is clipped in consonance with excess amplification, is output. The succeeding processing is the same as is described for the first embodiment. A reverberation-added output signal $S_6$, having a preferable reverberation characteristic, that corresponds to the amplitude level of the input tone signal $S_1$ is automatically and constantly produced.

It should be noted that a conditional branching procedure based on excess amplification is employed for digital processing. In other words, the value of the input tone signal $S_1$ is constantly compared with a desired value. When the condition "the amplitude level of the input tone signal $S_1$> the desired amplitude level of the input tone signal" is satisfied, program execution control moves to the subroutine where the input tone signal $S_1$ is transmitted to the distorted signal generator 10.

As described above, a reverberator according to the present invention extracts only a specific frequency band signal from a distorted signal that is obtained by distorting an input tone signal, mixes the input tone signal with the specific frequency band signal, adds reverberation to the resultant signal, and generates a high frequency band signal to which optimal reverberation has been added when an input tone signal is for a pure tone, that is, for only a sine wave overtone, to provide a preferable reverberation characteristic.

Further, when a high frequency band signal for preset overtones in the frequency response of an input tone signal cannot be detected, the reverberator of the present invention regulates excess amplification to output a distorted signal that is obtained by providing an input tone signal with a predetermined reverberation, and when an input tone signal has a narrow high frequency band of higher components that are predetermined overtones, a high frequency band signal having higher components, to which optimal reverberation can be added, is automatically produced to provide a preferable reverberation characteristic.

When an input tone signal level exceeds a preset amplitude level, or when the amplitude level of, for example, a percussion instrument sound signal exceeds the preset amplitude level, the reverberator regulates excess amplification to output a distorted signal that is obtained by providing the input tone signal with predetermined reverberation, and when the input tone signal has a narrow high frequency band of higher components that are predetermined overtones, a high frequency band signal of higher components, to which optimal reverberation can be added, is automatically generated to obtain a desirable reverberation characteristic.

Although the preferred embodiment of the present invention and the claims particularly point out the subject matter regarded as the invention, various other modifications are contemplated as being within the scope of the invention.

What is claimed is:

1. A reverberator for generating a reverberation-added signal from an audio input tone signal having a frequency characteristic, said reverberator avoiding flutter echo when said input to signal has sinusoidal wave form properties and comprising:

an input receiving said input tone signal;

distorted signal generating means coupled to said input, said distorted signal generating means distorting said input tone signal to introduce, into said input tone signal, a plurality of signal components exhibiting different frequencies including frequencies higher the frequency characteristic of the input tone signal, said distorted signal generating means outputting a distorted signal, said distorted signal generating means distorting said input tone signal by clipping peak magnitude portions of sinusoidal wave form properties of the input tone signal while retaining the remaining portions of the sinusoidal wave form properties;

predetermined high frequency band signal passing means for passing a signal in a predetermined frequency band of the frequencies of said distorted signal which frequencies are higher than the frequency characteristic of the input tone signal;

tone signal mixing means for mixing said input tone signal with said high frequency band signal; and reverberation adding means for adding reverberation to said mixed tone signal and for outputting a reverberation-added signal in which flutter echo is avoided.

2. A reverberator according to claim 1, further comprising frequency response monitoring and control means for, when a high frequency band signal for a preset overtone component of said input tone signal is not detected in a frequency analysis response of said input tone signal, controlling said distorted signal generating means to output a distorted signal obtained by introducing a predetermined distortion into said input tone signal.

3. A reverberator according to claim 1, further comprising amplitude level monitoring and control means for, when said input tone signal exceeds a preset amplitude level, controlling said distorted signal generating means to output said distorted signal obtained by introducing a predetermined distortion into said input tone signal.

4. A reverberator according to claim 1 further comprising output tone signal mixing means for mixing said reverberation-added signal from said reverberation adding means with said input tone signal and for providing a reverberation-added output tone signal in which flutter echo is avoided.

5. A reverberator according to claim 1, wherein said predetermined frequency band signal passing means is a high-pass filter comprising an analog signal filtering capacitor and resistor or comprising a digital signal processing IIR filter or FIR filter.

6. A reverberator according to claim 1, wherein said reverberation-adding means comprises, for analog processing, a mechanical reverberator that utilizes the vibration characteristics of a metal plate or spring member, and wherein for digital processing, said reverberation-adding means comprises a digital reverberator that produces a combination of multiple musical tones that have different delay times.

7. A reverberator according to claim 2, further comprising output tone signal mixing means for mixing said reverberation-added signal from said reverberation adding means with said input tone signal and for providing a reverberation-added output tone signal.

8. A reverberator according to claim 3, further comprising output tone signal mixing means for mixing said reverberation-added signal from said reverberation adding means with said input tone signal and for providing a reverberation-added output tone signal.

9. A reverberator according to claim 1 wherein said high frequency band signal passing means is further defined as passing signals in excess of 6 KHz.

* * * * *

UNITED STATES PATENT AND TRADEMARK OFFICE

CERTIFICATE OF CORRECTION

PATENT NO. : 5,502,768

DATED : March 26, 1996

INVENTOR(S) : Shioda

It is certified that error appears in the above-indentified patent and that said Letters Patent is hereby corrected as shown below:

CLAIM 1, Col. 7, Line 19, delete "to" and substitute therefor ---tone---; CLAIM 1, Col. 7, Line 26, before "the" and insert ---than---

Signed and Sealed this

Fourth Day of March, 1997

Attest:

BRUCE LEHMAN

*Attesting Officer*

*Commissioner of Patents and Trademarks*